United States Patent

Bailey et al.

[11] Patent Number: 5,274,193
[45] Date of Patent: Dec. 28, 1993

[54] HEAT SINK SPRING AND WEDGE ASSEMBLY

[75] Inventors: Terry G. Bailey, Huntsville; Bradley S. Chupp, Madison, all of Ala.

[73] Assignee: Chrysler Corporation, Highland Park, Mich.

[21] Appl. No.: 874,233

[22] Filed: Apr. 24, 1992

[51] Int. Cl.⁵ .................................. H05K 7/20
[52] U.S. Cl. .................... 174/16.3; 165/80.3; 361/704; 361/707; 361/807; 361/809
[58] Field of Search ............... 174/16.3; 257/718, 719; 165/80.3, 185; 361/383, 386, 388, 389, 417, 419, 420, 427

[56] References Cited

U.S. PATENT DOCUMENTS

| | | | |
|---|---|---|---|
| 4,674,005 | 6/1987 | Lacz | 174/16.3 X |
| 4,710,852 | 12/1987 | Keen | 174/16.3 X |
| 4,729,426 | 3/1988 | Hinshaw | 174/16.3 X |
| 4,845,590 | 7/1989 | Mikolajczak | 174/16.3 X |
| 4,891,735 | 1/1990 | Mikolajczak | 361/419 |
| 4,923,179 | 5/1990 | Mikolajczak | 174/16.3 X |
| 4,964,198 | 10/1990 | McCarthy | 174/16.3 X |
| 4,972,294 | 11/1990 | Moses, Jr. et al. | 174/16.3 X |
| 5,130,888 | 7/1992 | Moore | 165/80.3 X |
| 5,138,524 | 8/1992 | Smithers | 174/16.3 X |

*Primary Examiner*—Morris H. Nimmo
*Attorney, Agent, or Firm*—Mark P. Calcaterra

[57] ABSTRACT

A load spring for heat sink assemblies has an elongated body with a plurality of fingers, spring arms and a positioning mechanism extending from the body. Also, a wedge bar tensions and maintains the spring in a heat sink housing. The fingers apply a force onto the electrical components to clamp the electrical components against the heat sink housing to provide heat dissipation from the electrical components to the housing.

16 Claims, 2 Drawing Sheets

HEAT SINK SPRING AND WEDGE ASSEMBLY

BACKGROUND AND SUMMARY OF THE INVENTION

The present invention relates to load springs and, more particularly, to load springs with retaining wedge assemblies for heat sink housing. The spring clamps electrical components against a wall of a heat sink housing. The load springs securely clamp the electrical components against the heat sink housing to dissipate heat from the electrical components to the housing.

In electronic modules, various electrical components generate amounts of heat which cannot be adequately dissipated to the ambient surroundings without the utilization of a heat sink. Printed circuit boards are used to provide a support for the electrical conductors and the associated electrical components, generally solid state devices, that make up the electronic module. In order to have an effective transfer of heat from the solid state devices to the heat sink, the solid state devices must be securely clamped to the heat sink. It is also desirable to have the solid state devices mounted to the heat sink with a device that will permit easy installation on the heat sink and also with the associated circuit board. Further, it is desirable to have solid state devices (heat generating devices), in close proximity to the associated circuit board so as to minimize the length of the conductors required for connecting the solid state devices to the circuit board.

Springs have been utilized to retain electrical components within heat sink housings. Springs like those illustrated in U.S. Pat. Nos. 4,845,590, issued Jul. 4, 1989 and 4,891,735, issued Jan. 2, 1990, both assigned to the assignee of the present invention, the specifications of which are herein expressly incorporated by reference, show spring devices utilized to retain electrical devices within a housing. While these springs function satisfactorily for their intended purpose, designers are always striving to improve the art.

Accordingly, it is an object of the present invention to provide an improved load spring to secure electrical components with heat sink tabs against a heat sink housing. A load spring is provided which may easily be installed with a carrier and heat sink housing by an automated process. The load spring provides a clamping force which applies a desired retention force on the electrical components to maintain them against the housing wall. Also, the load spring includes a wedge mechanism to ensure tensioning of the load spring with the electrical devices.

From the subsequent description and claims taken in conjunction with the accompanying drawings, other objects and advantages of the present invention will become apparent to those skilled in the art.

DETAILED DESCRIPTION OF THE PREFERRED EMBODIMENT

Figure 1:
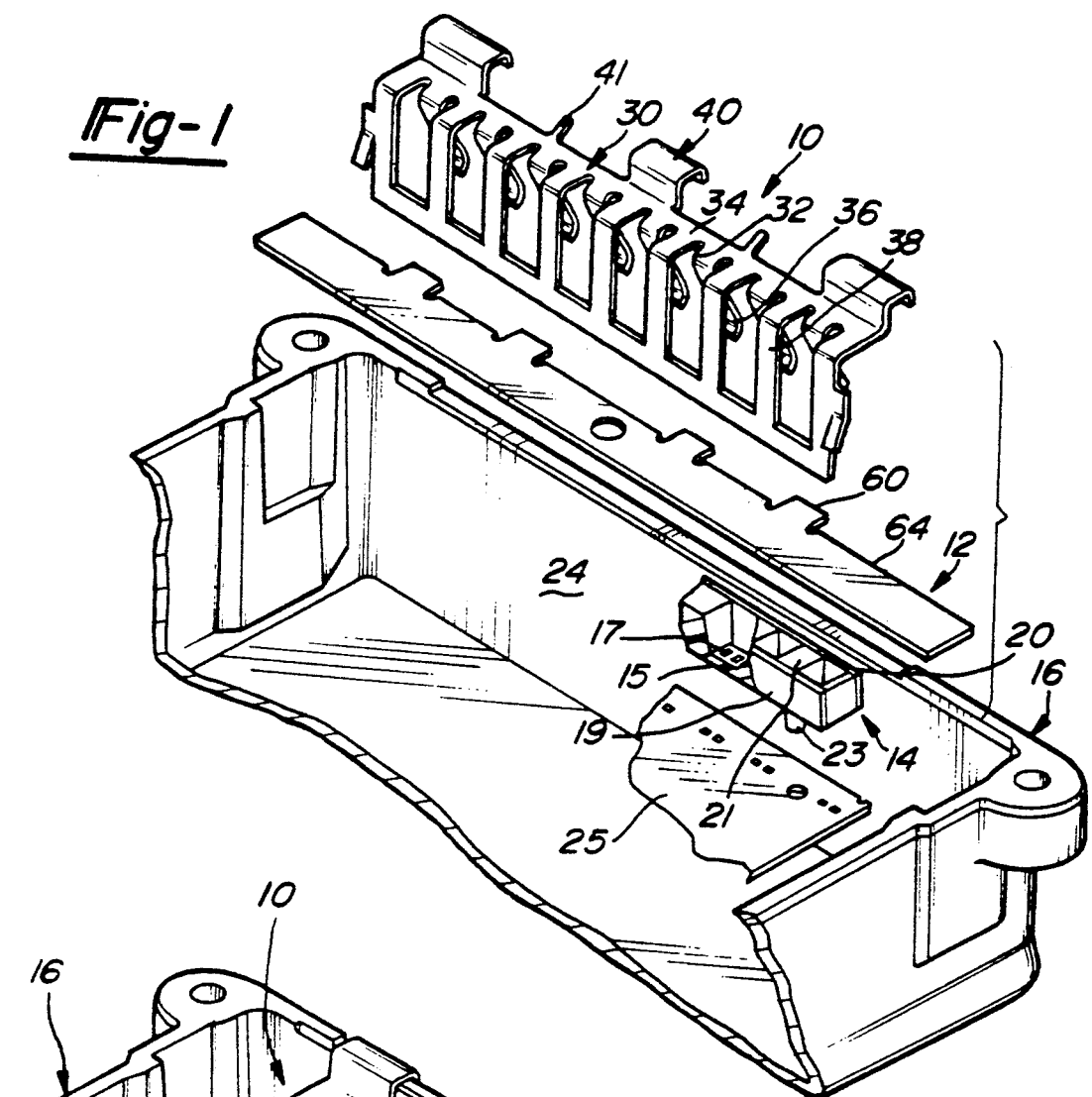
FIG. 1 is an exploded perspective view of a load spring of the present invention with a carrier and heat sink housing.
Figure 2:
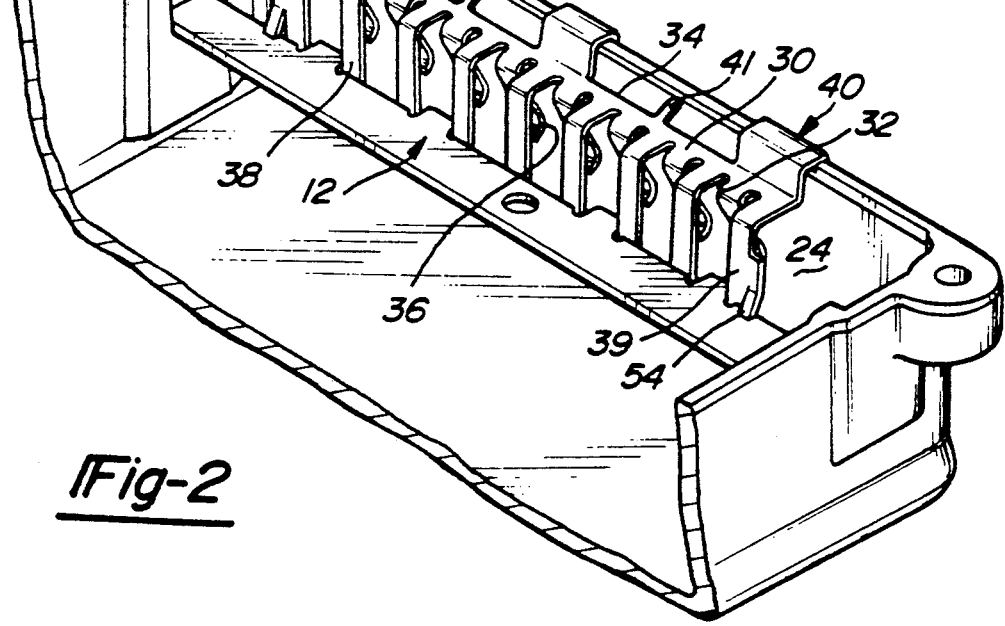
FIG. 2 is an assembled perspective view of the load spring of FIG. 1.
Figure 3:
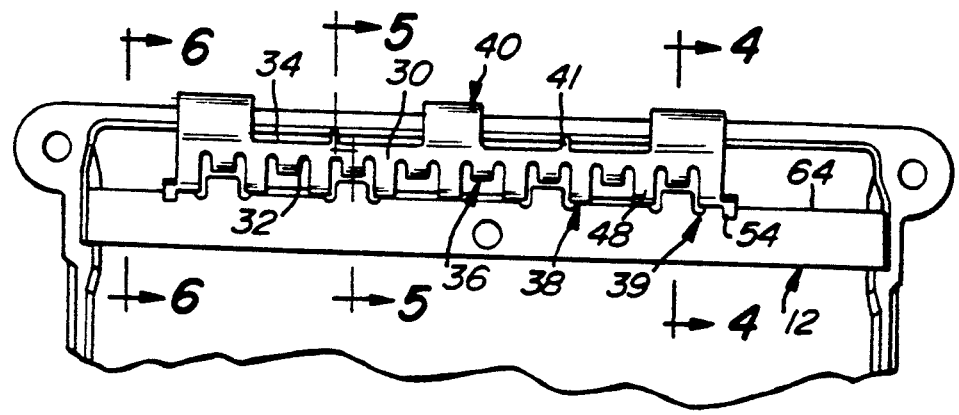
FIG. 3 is a top plan view of the load spring of FIG. 2.
Figure 4:
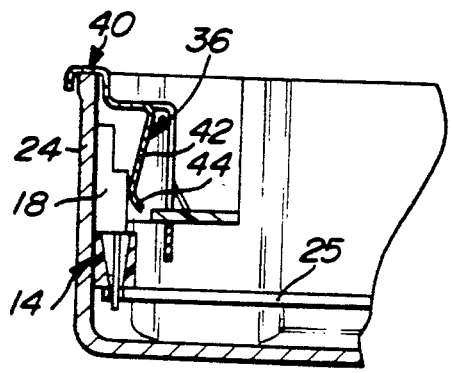
FIG. 4 is a sectional view of the load spring, the section being taken along line 4—4 of FIG. 3.

Referring to the figures, particularly FIG. 1, a load spring in accordance with the present invention is illustrated and designated with the reference numeral 10. The load spring 10 in FIG. 1 is illustrated with a wedge bar 12, an optional carrier member 14 and a heat sink housing 16. The load spring 10 is assembled with the wedge bar 12 and housing 14 to secure electrical components 18 against the housing 14 to dissipate heat from electrical components 18 to the heat sink housing 14, as seen in FIG. 2. The housing 14 includes a wall 24 providing a heat sink surface for the electrical components 18.

The carrier member 14 includes a base 15 with an elongated rectangular bar shape. A plurality of apertures 17 are formed in the base to receive conductors from the electrical components 18. A pair of longitudinal walls 19 and 20 and a plurality of cross walls 21 extend from the base 15 to form individual receiving receptacles for the electrical components 18. Also, the base 15 includes posts 23 to secure the carrier 14 to a circuit board 25.

Load spring 10 includes an elongated planar body member 30 having first and second edge portions 32 and 34. The first edge 32 includes a plurality of extending biasing finger members 36 and one or more spring arm members 38. The second edge portion 34 includes one or more extending flanges 40 and tabs 41. The load spring 10 is unitarily formed or stamped from a spring steel material and may be stamped, rolled, formed or the like into desired configurations.

To better understand the fingers 36, turn to FIGS. 1, 2, 4, 5 and 7. Fingers 36 are continuous with the first edge portion 32 of the body 30. Each finger 36 includes an angled portion 42 with a curled end 44 extending inward beneath the body 30. The curled end 44 is adapted to contact the electrical component 18 to maintain the components 18 against the heat sink wall 24. The configuration and positioning of the fingers 36 provide a desired force to be exerted against the electrical components 18 to maintain the electrical components 18 against the housing wall 24 when the spring 10 is in an assembled position, as seen in FIG. 2.

The fingers 36 extend from the first edge portion 32 of the body member 30 at desired positions along the length of the body 30. Spring arms 38 are positioned between adjacent fingers 36.

The spring arms 38 extend from the first edge portion 32 of the body 30. Generally, the spring arms 38 are L shaped with a portion 48 coplanar with the body 30 and a portion 50 substantially perpendicular thereto in the assembled position. The ends of the portions 50 are connected to one another with a continuous bar 51. The spring arms 38 in a pretensioned position, FIG. 7, having portion 50 at an angle with respect to the body 30.

Figure 6:
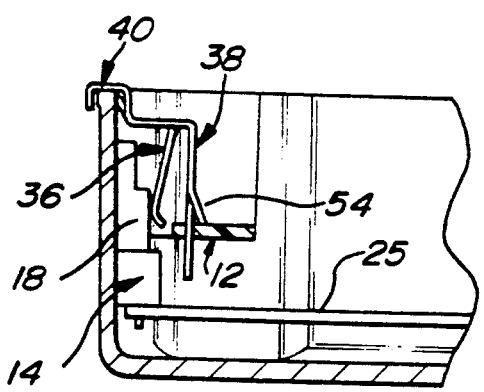
FIG. 6 is a sectional view of the load spring, the section being taken along line 6—6 of FIG. 3.
Figure 7:
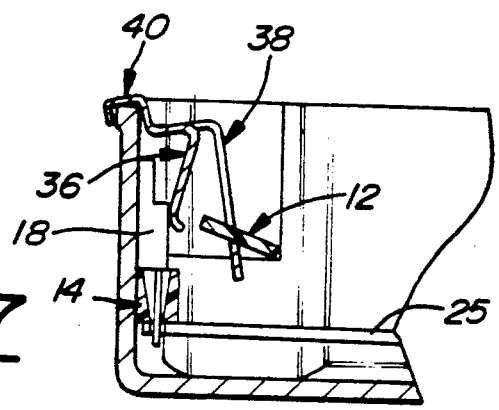
FIG. 7 is a view like FIG. 3 in a pretension condition.

The two end spring arms 39 include a resilient barb portion 54. The barb portion 54, best seen in FIGS. 1, 2 and 6, is substantially continuous with spring arm 39. The barb extends at an angle from the arm 39. As the wedge bar 12 is forced downward, as seen in FIG. 7, the barbs 54 move into a coplanar arrangement with portion 50 and, once the bar 12 passes, the barbs 54 resiliently spring back and lock the spring 10 with the wedge bar 12. The locking secures the spring in the housing as well as positions and tensions the spring arm 38, which, in turn, tensions the fingers 34.

The flanges 40 are continuous with the second edge portion 34 of the body 30. The flanges 40 extends from the second edge portion 34 opposing the first edge portion 32 and are L shaped extending from the second edge. The flanges 40 extend over the wall 24 of the housing to provide positioning of the spring 10 on the housing wall 24. Also, the flanges 40 enable the spring 10 to attach itself to the housing wall in a clip-like fashion over the edge of the housing wall 24. This attachment provides a solid foundation to enable spring force to be applied to the electrical components 18 by the fingers 36.

Figure 5:
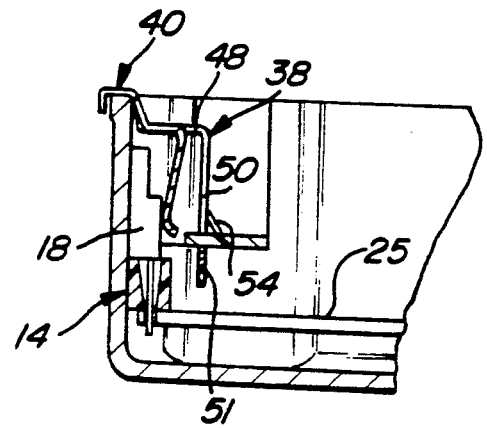
FIG. 5 is a sectional view of the load spring, the section being taken along line 5—5 of FIG. 3.

The tabs 41 likewise extend from the second edge 34 of the body 30. The tabs 41 are designed to cut into the heat sink wall 24, in an assembled position as shown in FIG. 5, to prevent movement of the spring. The tabs 41 are resilient and angled with respect to the body 30.

The wedge bar 12 has an overall rectangular planar shape with a plurality of extending nubs 60. The nubs 60, as can be seen in FIG. 2, extend between adjacent spring arms inward towards the fingers 36. The nubs 60 enable positioning of the wedge bar with respect to the spring 10.

During assembly of the heat sink housing, a PC board with the electronic devices 18 thereon would be positioned into the heat sink housing 16. The electronic devices may be in a carrier 14 like that described herein, or may be self standing onto the PC board. The spring, via the flanges 40, may be positioned onto the wall 24 of the heat sink housing 16. The fingers 34 would abut the electrical devices 18 like that illustrated in FIG. 7. The wedge bar 12 would be positioned into the housing recesses and would come to rest at an angle on the barbs 54 as illustrated in FIG. 7. A downward force would be applied on the wedge bar 12 to resiliently move the barbs 54 into a coplanar position with the portion 50 of the spring arms 39. Once the wedge bar 12 is positioned below the barbs 54, the barbs resiliently spring outwardly locking the wedge bar 12 in position as illustrated in FIG. 2. As the wedge bar 12 is f orced downward, the wedge bar edge 64 exerts a loading or tensioning force onto spring arms 38 which, in turn, load or tension the spring fingers 36. Thus, the spring 10 is positioned onto the housing 16 and the spring fingers are loaded to retain the electrical devices 16 against the housing wall 24. The assembly of the spring onto the housing may be accomplished by automation utilizing robotics to load the spring and wedge and secure the wedge in the housing.

The wedge bar force on the spring arms and spring fingers makes it substantially impossible for the clamping force from the electronic devices to be removed through normal handling. Also, the assembly provides better thermal transfer from the heat sink to ambient air. This transfer is due to the fact that there is very little external overhang with respect to the flanges. There is much more heat sink surface which enables the heat transfer to occur. Also, as mentioned above, the spring and wedge assembly may be used with or without a carrier assembly.

While the above provides a detailed description of the preferred embodiment, it will be understood that the present invention is susceptible to modification, variation and alteration without deviating f rom the scope and spirit of the subjoined claims.

What is claimed is:

1. A load spring for heat sink assemblies comprising:
   an elongated body member;
   one or more biasing members extending from said body member, said one or more biasing members adapted for contacting electrical components to be secured in a heat sink assembly;
   means for securing the load spring in a housing of said heat sink assembly, said securing means being adapted to be received within recesses formed in said housing and adapted to fittingly engage a member extending from said body member to thereby secure said securing means with said load spring; and
   means for positioning the load spring with respect to said heat sink housing, said positioning means associated with said body member.

2. The load spring according to claim 1 wherein said one or more biasing members each include a bowed portion for contacting electrical components to be surred in the heat sink assembly.

3. The load spring according to claim 1 wherein said positioning means further comprising one or more flanges and tab members for contacting a wall o the heat sink housing to position the load spring on the heat sink housing.

4. The load spring according to claim 1 wherein said securing means further comprising a wedge member having extending nubs for positioning said wedge member with said load spring.

5. The load spring according to claim 1 wherein said body member includes a plurality of extending arms for spacing said securing means with respect to said housing.

6. The load spring accord to claim 1 wherein said body extending member includes a resilient tang for locking said securing means with said extending member.

7. A load spring for heat sink assemblies comprising:
   an elongated body member;
   a plurality of fingers extending from said body members, said plurality of fingers including a bowed portion adapted for contacting electrical components to maintain the electrical components abutted against a housing of that sink assemblies;
   one or more flanges extending from said body member, said one or more flanges adapted to overengage a wall of the heat sink housing for positioning the spring with respect to the heat sink housing; and
   wedge means for securing said load spring in said housing, said wedge means adapted to be coupled with an arm extending from said elongated body.

8. The load spring according to claim 7 wherein said plurality of fingers each have a free extending end having a curled portion adapted to contact an electrical component.

9. The load spring according to claim 7 wherein said arm includes a free extending end with means for securing with the wedge means.

10. The load spring according to claim 7 wherein said plurality of fingers and flange extend from opposing sides of said body member.

11. The load spring according to claim 7 wherein a plurality of arms are positioned between adjacent fingers such that the arms contact said wedge means to tension said spring in said housing.

12. The load spring according to claim 7 wherein one or more tabs extend from said elongated body to contact with said one or more flanges to position said spring in said housing.

13. A load spring for heat sink assemblies comprising:
 an elongated body member, said body member having a first and second edge portion;
 a plurality of fingers extending rom said first edge portion of said body member, said fingers having a portion extending beneath said body and adapted for contacting electrical components for maintaining the electrical components in contact with heat sink housings, said fingers having a curled portion at their free extending ends;
 one or more spring arms extending from said first edge portion for tensioning said load spring fingers, said spring arms extending from said first edge portion a desired distance away from said body, and at least one spring arm including a barb member at its free extending end to couple the spring with a wedge bar;
 one or more flange members and tab members extending from said second edge portion and opposing said first edge portion, said flange and tab members adapted to position the spring on a wall o the heat sink housings; and
 wedge bar for retaining said spring in said housings, said wedge bar locking with said barb member and applying force on said spring arms which, in turn, retain said electrical components against said housing wall.

14. The load spring according to claim 13 wherein said tab member cuts into said housings to prevent movement of said spring.

15. The load spring according to claim 13 wherein said wedge bar includes extending nubs for positioning said wedge bar with said spring arms.

16. The load spring according to claim 13 wherein said plurality of spring arms extend away from said first edge portion a distance greater than said plurality of fingers.

* * * * *